United States Patent
Keum (10) Patent No.: US 10,079,762 B1
(45) Date of Patent: Sep. 18, 2018

(54) TEST COMMUNICATION PROTOCOL

(71) Applicant: Teradyne, Inc., North Reading, MA (US)

(72) Inventor: Byoung J. Keum, Westford, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 15/495,357

(22) Filed: Apr. 24, 2017

(51) Int. Cl.
| | |
|---|---|
| H04L 12/801 | (2013.01) |
| H04L 5/00 | (2006.01) |
| G01R 31/28 | (2006.01) |
| H04L 12/807 | (2013.01) |
| H04L 12/26 | (2006.01) |

(52) U.S. Cl.
CPC .......... H04L 47/11 (2013.01); G01R 31/2834 (2013.01); H04L 5/0055 (2013.01); H04L 43/0829 (2013.01); H04L 47/27 (2013.01); H04L 47/34 (2013.01)

(58) Field of Classification Search
None
See application file for complete search history.

(56) References Cited

U.S. PATENT DOCUMENTS

| | | | | |
|---|---|---|---|---|
| 7,222,255 B1* | 5/2007 | Claessens | ........... | H04L 12/2697 709/224 |
| 7,325,075 B1 | 1/2008 | Chiu | | |
| 7,733,858 B1 | 6/2010 | Fay | | |
| 7,869,381 B1* | 1/2011 | Hatley | ........ | H04L 43/50 370/252 |
| 8,174,991 B1* | 5/2012 | Trivedi | ........ | H04L 43/50 370/241 |
| 8,832,309 B2* | 9/2014 | Gintis | ........ | H04L 43/50 709/236 |
| 2002/0121913 A1 | 9/2002 | Miller et al. | | |
| 2006/0162532 A1* | 7/2006 | Eidson | ........ | G05B 19/042 84/600 |
| 2008/0112332 A1* | 5/2008 | Pepper | ........ | H04L 43/028 370/250 |

(Continued)

OTHER PUBLICATIONS

International Search Report for PCT/US2018/025398, 3 pages (dated Jul. 5, 2018).

(Continued)

Primary Examiner — Brian Roberts
(74) Attorney, Agent, or Firm — Choate, Hall & Stewart LLP (57) ABSTRACT

An example method includes broadcasting periodically, from a computing system, control packets over a network to instrument modules, where a control packet includes data representing sequence numbers of last data packets received from the instrument modules and information based on the sequence numbers, and the control packet includes slots for all of the instrument modules, with each slot containing the data that is specific to one of the instrument modules. The example method also includes receiving, at the computing system and in response to the control packet, via unicast and over the network, an acknowledgement packet from each of the instrument modules, where the acknowledgement packet includes repair information that is based on a broadcast control packet received by the instrument module from the computing system.

26 Claims, 7 Drawing Sheets

(56) References Cited

U.S. PATENT DOCUMENTS

| | | | | |
|---|---|---|---|---|
| 2009/0262743 | A1* | 10/2009 | Uyehara | H04L 43/08 370/394 |
| 2011/0280137 | A1* | 11/2011 | Bockwoldt | H04L 12/2697 370/252 |
| 2013/0028254 | A1* | 1/2013 | Rozehrezvani | H04L 47/15 370/390 |
| 2013/0138383 | A1 | 5/2013 | Filler et al. | |
| 2013/0346628 | A1* | 12/2013 | Canion | H04L 63/0876 709/245 |
| 2014/0160961 | A1 | 6/2014 | Dragulescu et al. | |

OTHER PUBLICATIONS

Written Opinion for PCT/US2018/025398, 7 pages (dated Jul. 5, 2018).

* cited by examiner

TEST COMMUNICATION PROTOCOL

TECHNICAL FIELD

This specification relates generally to a test communication protocol that is usable to implement communications between a host computer and test instrument modules ("instrument modules").

BACKGROUND

Automatic test equipment (ATE) includes electronics for sending signals to, and receiving signals from, a device under test (DUT) in order to test the operation of the DUT. The ATE includes instrument modules that may be configured to send and to receive signals as part of the testing process. Different instrument modules may perform different tests and, in some cases, may be used to test different DUTs. A host computer coordinates testing by communicating with the instrument modules.

The transmission control protocol (TCP) has been used to implement communications between the host computer and the instrument modules. Traditionally, individual connections were maintained between the host computer and each instrument module. In some cases, particularly for larger numbers of connections, it can be difficult for the test system to maintain and to manage so many individual connections while also meeting required reliability, latency, and bandwidth constraints. This can be especially true when the individual connections are maintained over Ethernet.

SUMMARY

An example test system comprises: instrument modules to control testing of one or more devices under test; an Ethernet-based communication network; and a computing system configured to broadcast, periodically, control packets over the Ethernet-based communication network to the instrument modules. A control packet comprises data representing sequence numbers of last data packets received from the instrument modules and information based on the sequence numbers. The control packet comprises slots for all of the instrument modules, with each slot containing the data that is specific to one of the instrument modules and with each slot being indexed based on an identifier for the one of the instrument modules. The example test system also comprises the computing system configured to receive, via unicast and over the Ethernet-based communication network, an acknowledgement packet from each of the instrument modules in response to the control packet. The acknowledgement packet comprises repair information that is based on the control packet received by the instrument module from the computing system. The example test system may include one or more of the following features, either alone or in combination.

The repair information may comprise data packets having sequence numbers missing from data packets received by the computing system from the instrument module. The control packet may comprise information indexed based on an instrument module identifier for access by an instrument module having the instrument module identifier. The control packet may comprise global information, with the global information being usable by each of the instrument modules to regulate a communication connection of message traffic between the computing system and the instrument module. The global information may comprise traffic congestion status of the computing system. The traffic congestion status may comprise one or more of: congestion window control information or data flow control information. The information based on a sequence number may comprise a number of dropped packets after the sequence number (e.g., packet gap information).

The computing system may be configured to send broadcast messages over the Ethernet-based communication network to the instrument modules. A broadcast message may comprise a data packet comprising a sequence number, steering information to identify instrument modules, and commands defining actions to be taken. The computing system may be configured to receive, over the Ethernet-based communication network, a unicast message from each of the instrument modules in response to the data packet, with each unicast messages comprising response data from an instrument module that sent the unicast message. The data packet may comprise a first data item representing a request for test information from the instrument module, and at least some of the response data may represent the test information. The computing system may be is configured to determine, based on the sequence number of the last data packet received from the computing system, that one or more data packets are missing from an instrument module, and the computing system may be configured to broadcast a control packet identifying that one or more data packets are missing. The computing system may be configured to receive, via unicast message, the one or more data packets that are missing in response to the control packet. The Ethernet-based communication network may comprise a local area network (LAN). The computing system may be configured to broadcast Ethernet communications among the control packets.

An example method is performed on automatic test equipment for enabling communication between a computing system and instrument modules. The example method comprises broadcasting periodically, from the computing system, control packets over an Ethernet-based communication network to the instrument modules. A control packet comprises data representing sequence numbers of last data packets received from the instrument modules and information based on the sequence numbers. The control packet comprises slots for all of the instrument modules, with each slot containing the data that is specific to one of the instrument modules and with each slot being indexed based on an identifier for the one of the instrument modules. The example method comprises receiving, at the computing system and in response to the control packet, via unicast and over the Ethernet-based communication network, an acknowledgement packet from each of the instrument modules. The acknowledgement packet comprises repair information that is based on a broadcast control packet received by the instrument module from the computing system. The example method may include one or more of the following features, either alone or in combination.

The repair information may comprise data packets having sequence numbers missing from data packets received by the computing system from the instrument modules. The control packet may comprise information indexed based on instrument module identifier for access by an instrument module having the instrument module identifier. The control packet may comprise global information, with the global information being usable by each of the instrument modules to regulate a communication connection of message traffic between the computing system and the instrument module. The global information may comprise traffic congestion status of the computing system. The traffic congestion status may comprise one or more of: congestion window control information or data flow control information. The information based on a sequence number may comprise a number of dropped packets after the sequence number (e.g., packet gap information).

The example method may comprise sending, from the computing system, broadcast messages over the Ethernet-based communication network to the instrument modules, with a broadcast message comprising a data packet comprising a sequence number, steering information to identify instrument modules, and commands defining actions to be taken; and receiving, at the computing system and over the Ethernet-based communication network, a unicast message from each of the instrument modules in response to the data packet, with each unicast messages comprising response data from an instrument module that sent the unicast message.

The data packet may comprise a first data item representing a request for test information from the instrument module, and at least some of the response data may represent the test information.

The example method may comprise determining, by the computing system and based on a sequence number of a last data packet received by the computing system, that one or more data packets from an instrument module are missing; and broadcasting, from the computing system, a control packet identifying that one or more data packets are missing. The example method may comprise receiving, at the computing system and via unicast message, the one or more data packets that are missing in response to the control packet.

The Ethernet-based communication network may comprise a local area network (LAN). The computing system may broadcast Ethernet communications among the control packets.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Described herein are example test systems that employ a communication protocol that may be used, e.g., to implement communications between a host computer and one or more instrument modules. In an example, the test system includes the host computer, multiple instrument modules, and an Ethernet-based communication network, such as a local area network (LAN), over which the host computer communicates with the instrument modules. In some examples, the test communication protocol employs control packets, acknowledgement packets, content packets, and response packets. In some implementations, each control packet contains multiple slots—one slot indexed to each instrument module. In some implementations, each slot is indexed based on a module identifier (ID) that is specific to the instrument module for which the slot is indexed. In some implementations, each slot contains data representing the sequence number of the last data packet received from that instrument module (the sequence number identifies, numerically, the location of a subject packet in a stream of data packets), and data representing the number of detected gaps following the sequence number (e.g., a number of numbers missing in the sequence). In some implementations, each control packet contains one or more values indicating the amount of network congestion experienced by the host computer. In the example test protocol, the same control packet is broadcast periodically over the LAN (or other, appropriate communication network) from the host computer to all of the instrument modules. In an example, a control packet is broadcast every one millisecond (1 ms); however, in other examples, the broadcast rate may be different.

The instrument modules receive the control packet, and each instrument module accesses data in the slot dedicated (e.g., indexed) to that instrument module. In an example, the instrument module may determine, based on the data in its dedicated slot, that the host computer is missing data packets that the instrument module previously sent to the host computer. In this example, the instrument module may wait for the next control packet to confirm that the packets are still missing. For example, it may be the case that there are delays in transmission of the packets. In response to the data representing that the data packets are missing (or still missing), the instrument module may send periodically, via unicast, an acknowledgement packet containing repair information, e.g., the missing data packets. In an example, an acknowledgement packet may be sent every ten milliseconds (10 ms); however, in other examples, the rate may be different. In another example, an instrument module may access the data from the packet, and determine that the host computer's network connection is congested. Accordingly, the instrument module may throttle-down its data send rate until that congestion is relieved. Typically, congestion is a global parameter that, in an example, is the same parameter that is sent to, and received by, each of the instrument modules and that each of the instrument modules reacts to accordingly.

Thus, in some implementations, each instrument module determines its traffic status and individually performs any necessary packet transmission repairs, without affecting communications between the host computer and other instrument modules. Moreover, the processing, e.g., determination and repair, is off-loaded to the instrument modules, thereby relieving the host computer for other tasks.

Substantive communications between the host computer and each instrument module may occur between, or during, the exchange of control packets and acknowledgement packets. These communications may be event-driven, and include, e.g., the exchange of test patterns and test data between the instrument modules and the host computer. A content packet is used for communications from the host computer to the instrument modules, and is a type of data packet. In an example, each content packet contains a message that includes a sequence number (S), steering information, and commands. The steering information is used to identify which instrument modules should act on which resource(s) (e.g., DUT(s) or other target(s)). The commands indicate which actions selected instrument modules should execute or perform on the resource(s). In some implementations, the commands contain or define all or part of instructions, test data, and/or other information that is usable by a receiving instrument module to perform appropriate tests on a device under test (DUT) or other operations. The sequence number identifies, numerically, the location of the subject packet in a stream of packets, and is used to track the order of content packets so that lost packets can be retransmitted. In some implementations, the acknowledgement packet may contain a sequence number of a last data packet received from the computing system and, if that sequence number is not for the last packet transmitted by the computing system, the computing system may retransmit any missing packets.

In some implementations, the same content packet is broadcast over the LAN (or other, appropriate communication network) from the host computer to all of the instrument modules. Each instrument module may identify the data in the content packet that is destined for that module based on the packet's steering information. The instrument module may then perform whatever processing or communications are appropriate given the data that was contained in the content packet.

Each instrument module may send, via unicast, a response to each content packet. The responses may be sent at different or the same times, as appropriate. A response packet may contain information that is based on data in the data packet that was for that instrument module. For example, the response packet may contain all or part of test results from the DUT, status information about the DUT, status information about the instrument module, and/or any other appropriate information. In some cases, the response packet, despite its name, may not actually contain responsive data, but rather may contain data for a communication to the host computer that has been initiated by an instrument module or a DUT connected thereto. A stream of response packets may be required to convey information from an instrument module to the DUT. Each response packet includes a sequence number in this example. As described, the host computer keeps track of sequence numbers of packets received from the various instrument modules. If any packets are missing from the sequence of response packets received from an instrument module, the communication protocol, including the control packets and the acknowledgement packets, may implement necessary repairs (e.g., provide the missing packets), as described herein.

The communication protocol described herein is not limited to use in a testing context, and may be used in any appropriate context to increase the reliability of communications between two devices connected over a network for communication. In general, communications over Ethernet can be unreliable and the communication protocol described herein may be used, in some cases, to improve the reliability of Ethernet-based communications as described herein. In some implementations, the example communication protocol may be implemented on a network having relatively low latency (e.g., 50 μs round-trip) and relatively high bandwidth (e.g., 6 gigabits-per-second (gb/s)), although the example communication protocol is not limited to use on a network of this type, and may be implemented on any appropriate communication network, including non-Ethernet-based networks. Although the communication protocol is not limited to use in a testing context, an example test system is described below to illustrate an implementation of the communication protocol.

Figure 1:
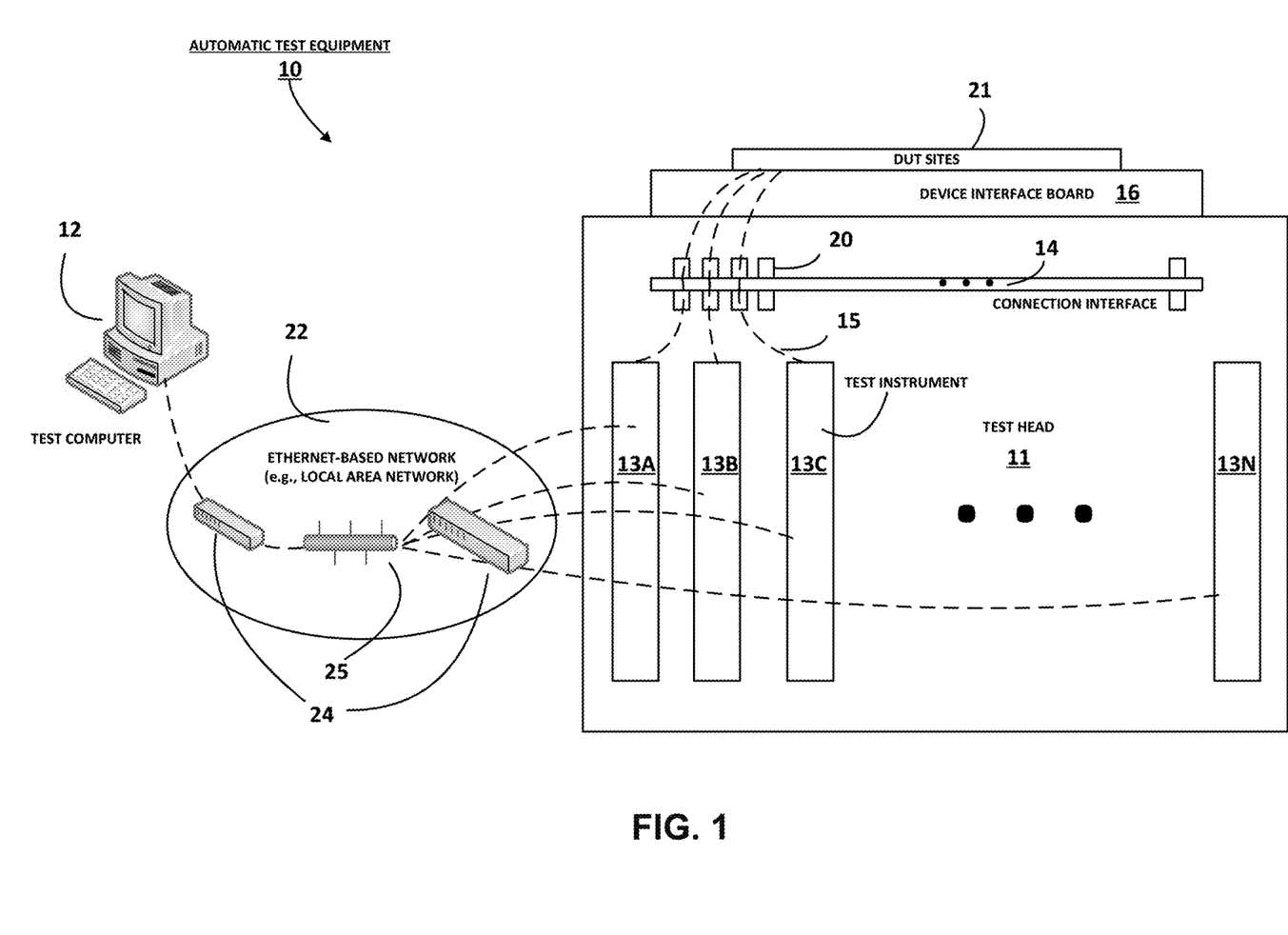
FIG. 1 is a block diagram of a system on which the example test protocol described herein may be implemented.

FIG. 1 shows components of example automatic test equipment (ATE) 10 in which the example communication protocol may be used. As noted, however, the communication protocol is not limited to use in the context of testing or to use with the example ATE described herein, but rather may be used in any appropriate technical context, including outside of a testing environment. In FIG. 1, the dashed lines represent, conceptually, potential signal paths between components of the ATE.

ATE 10 includes a test head 11 and a host computer 12. Test head 11 interfaces to one or more DUTs (not shown) on which tests are performed, and host computer 12 communicates with test head 11 to control testing. For example, host computer 12 may download test program sets to instrument modules on the test head, which then run the test program sets to test DUTs in communication with the test head. Host computer 12 may also send, to instrument modules in the test head, instructions, test data, and/or other information that is usable by the corresponding instrument module to perform appropriate tests on a DUT interfaced to the test head. As explained above, this information may be sent by broadcasting, to each instrument module, the same content (e.g., data) packet to each instrument module. Each instrument module may respond, via unicast or other appropriate mechanism, with a response packet stream containing appropriate response data, such as test responses, DUT status, instrument status, and so forth. As also explained above, reliability of communications may be maintained by the instrument modules through receipt of broadcast control packets, and sending of acknowledgement packets containing, among other things, repair information identified based on the control packets.

In this example, ATE 10 includes instrument modules 13A to 13N. Although only four instrument modules are depicted, the test system may include any appropriate number of instrument modules, including those resident outside of test head 11. Each instrument module may be configured to output test signals to test a DUT based, e.g., on data provided by the host computer, and to receive signals from the DUT. Different instrument modules may be responsible for performing different tests and/or for testing different DUTs. The signals received may include response signals that are based on the test signals and/or signals that originate from the DUT that are not prompted by (e.g., are not in response to) test signals. These signals may be formatted as data for output to the host computer in a stream of response packets, as described herein. In this regard, even though the packets are called "response" packets, they may contain data that is not necessarily responsive to information received from the host computer.

In some implementations, the host computer 12 communicates with the instrument modules over a computer network 22, which may include an appropriate Ethernet-based communication network. For example, network 22 may be, or include, a LAN, wide area network (WAN), or a combination thereof. The network(s) may provide for communications under various modes or protocols including, e.g., Transmission Control Protocol/Internet Protocol (TCP/IP) or User Datagram Protocol (UDP)/IP. In some implementations, network 22 includes switches 24 configured to forward Ethernet frames of a data packet over Ethernet 25 without performing non-routing functions, such as processing to change what the data packet represents. For example, the switches may be configured for transmission of packets along the network only, and may not be configured to perform computing functions like some Internet-based routers. In some implementations, network 22 does not include the Internet; however, that is not a requirement.

In the example of FIG. 1, ATE 10 includes a connection interface 14, which connects instrument module outputs 15 to a device interface board (DIB) 16. Connection interface 14 may include connectors 20 or other devices for routing signals between the respective instrument modules and DIB 16. For example, the connection interface may include one or more circuit boards or other substrates on which such connectors are mounted. Other types of connections may be used.

In the example of FIG. 1, DIB 16 connects, electrically and mechanically, to test head 11. The DIB includes sites 21, which may include pins, traces, or other points of electrical and mechanical connection to which one or more DUTs may connect—e.g., one DUT per site. Test signals, response signals, and other information pass over the sites between the DUT and instrument modules 13A to 13N. DIB 16 also includes, among other things, connectors, conductive traces, and circuitry for routing signals among the instrument modules.

FIGS. 2 to 5 show examples of data packets that may be employed in the example communication protocol described herein. The features shown in FIGS. 2 to 5 are examples, and are limited to those features used to in the description of the protocol. Each packet may, and will, include additional features not shown in the figures. Furthermore, the example protocol is not limited to the structures of the packets shown in FIGS. 2 to 5. Any appropriate packets structures may be used.

Figure 2:
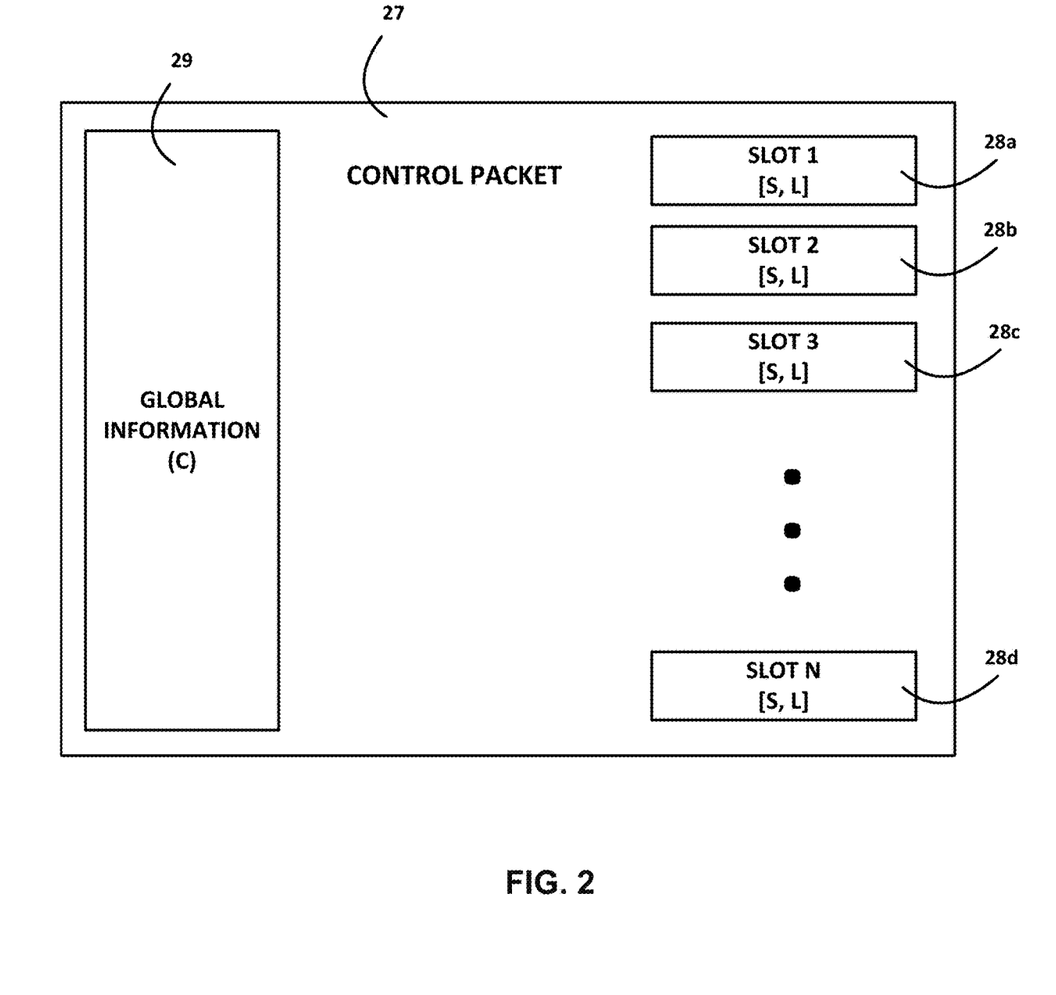
FIG. 2 is a block diagram of parts of an example control packet that may be used in the example test protocol.

FIG. 2 shows an example structure of a control packet 27. As shown, control packet 27 includes multiple slots 28a to 28d—one slot to hold data destined for each instrument module. Although only four slots are depicted, any appropriate number of slots may be used. As explained, the slots may be indexed by module ID (M), enabling the appropriate instrument module to access data from its corresponding slot. In some implementations, the slots may contain, e.g., the sequence number (S) of the last data packet received by the host computer from that instrument module M, and the number of detected gaps (L) following the sequence number (e.g., the number of packets missing following the last sequence number). The control packet also contains a value (C) indicating the amount of network congestion experienced by host computer in its connection to the instrument modules. The amount of network congestion is part of global information 29 that is accessible by, and usable by, all of the instrument modules. The global information may include information other than that specified, such as congestion window control information or other appropriate data flow control information. As described herein, this information may be used by the instrument modules to control the rate at which they send data to the host computer.

Figure 3:
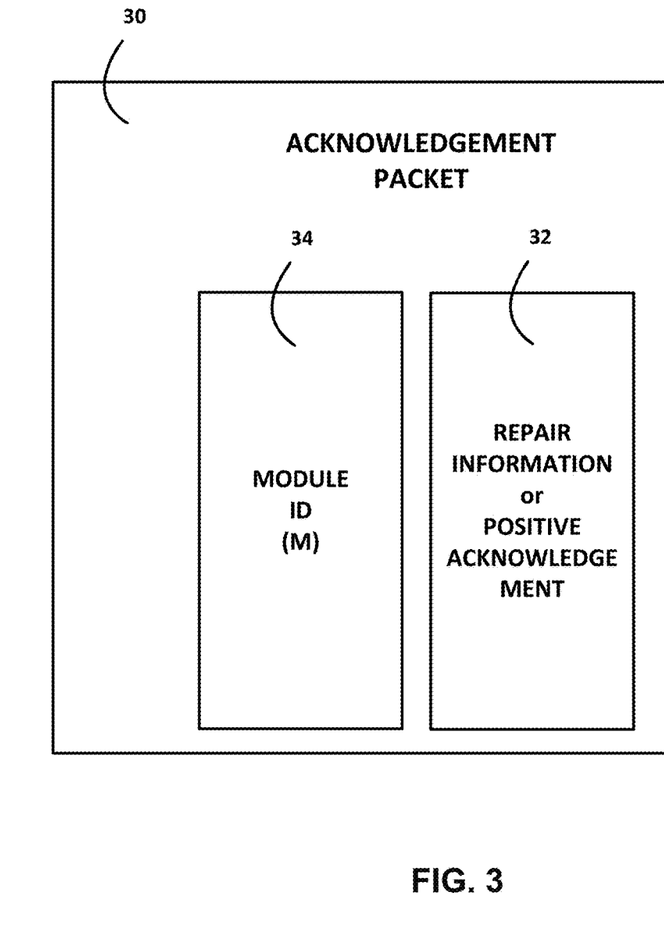
FIG. 3 is a block diagram of parts of an example acknowledgement packet that may be used in the example test protocol.

FIG. 3 shows an example structure of an acknowledgement packet 30. Acknowledgement packet 30 may contain repair information 32, which may be used to repair the flow of data packets between the host computer and the instrument module. Examples of repair information include, but are not limited to, missing data packets in a sequence of data packets, as determined from the control packet(s). If no repair is required in a particular case, a positive acknowledgement may be sent, which indicates that the current packet flow is accurate, and no repair is necessary. The acknowledgement packet also includes the module ID 34, which identifies the instrument module sending the packet.

Figure 4:
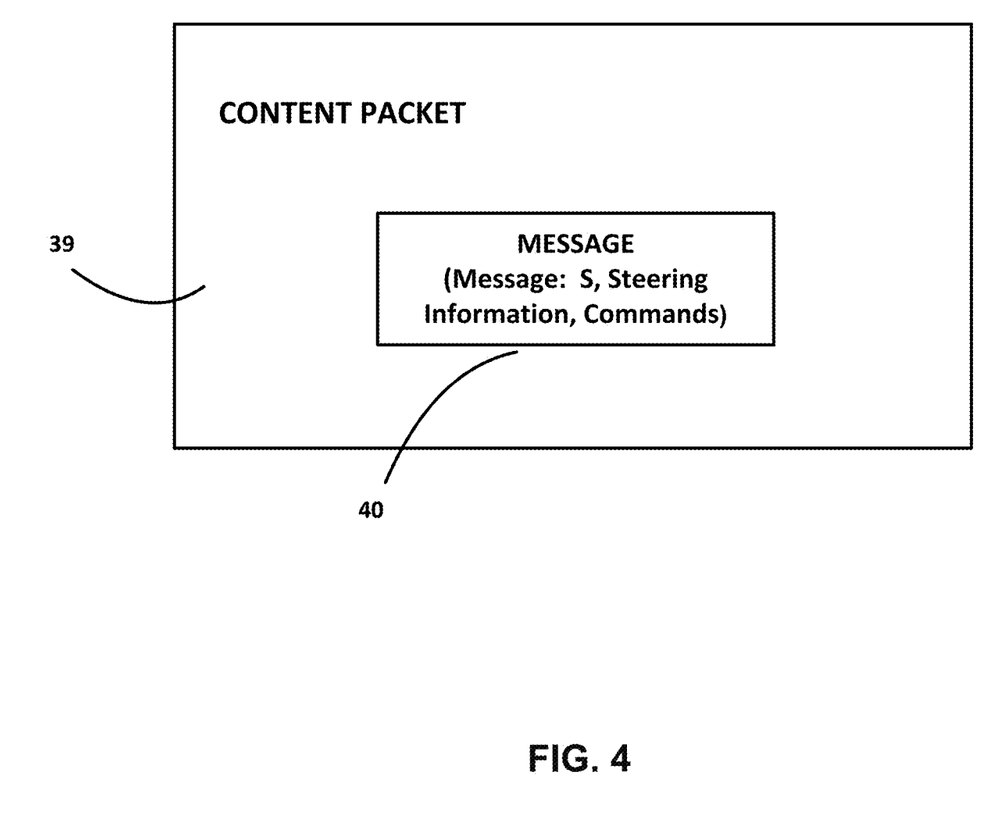
FIG. 4 is a block diagram of parts of an example content packet that may be used in the example test protocol.

FIG. 4 shows an example structure of a content packet 39 (e.g., a packet to send substantive data from the host computer to the various instrument modules). In this example, the content packet includes a message 40. In this example, message 40 includes a sequence number (S), steering information, and commands. The sequence number identifies, numerically, the location of the subject packet in a stream of packets, and is used to track the order of content packets so that lost packets can be retransmitted. For example, the acknowledgement packet may identify, to the host computer, the last sequence number received by an instrument module. If necessary, the host computer may use this information to retransmit missing packets. The steering information is used to identify which instrument modules should act on which resource(s) (e.g., DUT(s) or other target(s)). The commands indicate which actions selected instrument modules should execute or perform on the resource(s).

Figure 5:
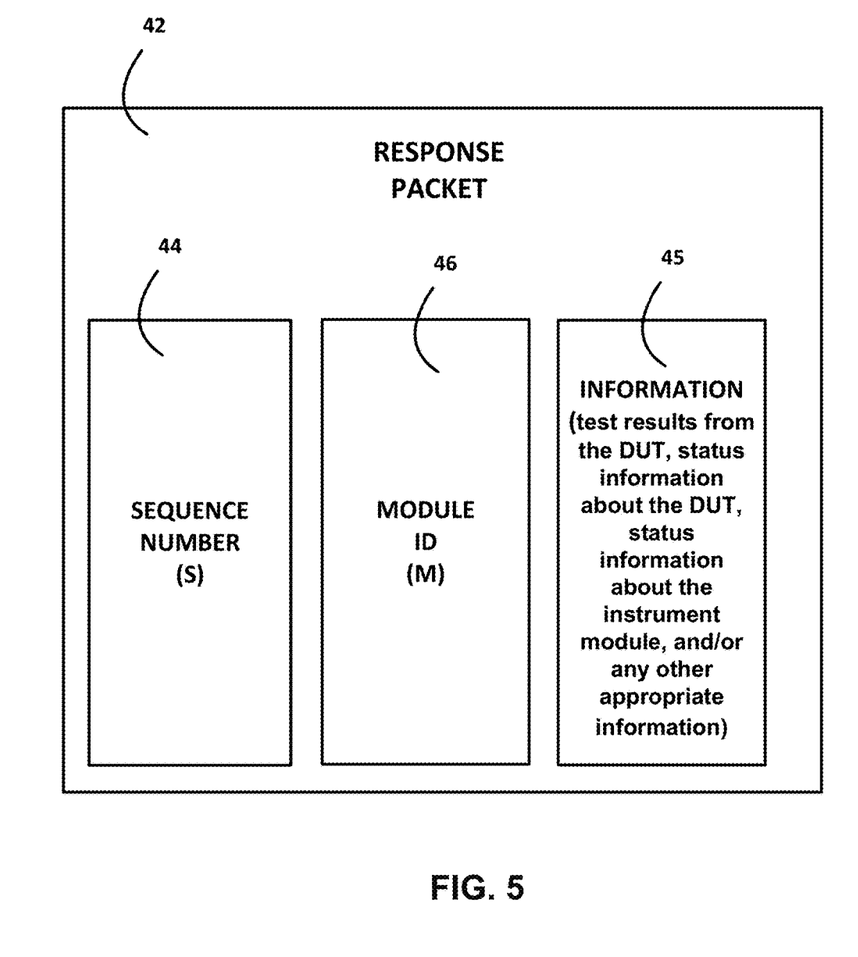
FIG. 5 is a block diagram of parts of an example response packet that may be used in the example test protocol.

FIG. 5 shows an example structure of a response packet 42. Response packet 42 includes a sequence number (S) 44. As noted, the sequence number identifies, numerically, the location of the subject packet in a stream of packets, e.g., the numerical location of the current packet among a stream of packets. For example, if the packet's sequence number is five, that means that it is the fifth packet to be output following the first, second, third, and fourth packets in the stream. The response packet may also include information 45, such as all or part of test results from the DUT, status information about the DUT, status information about the instrument module, and/or any other appropriate information. The response packet also includes the module ID 46, which identifies the module sending the packet.

Figure 6:
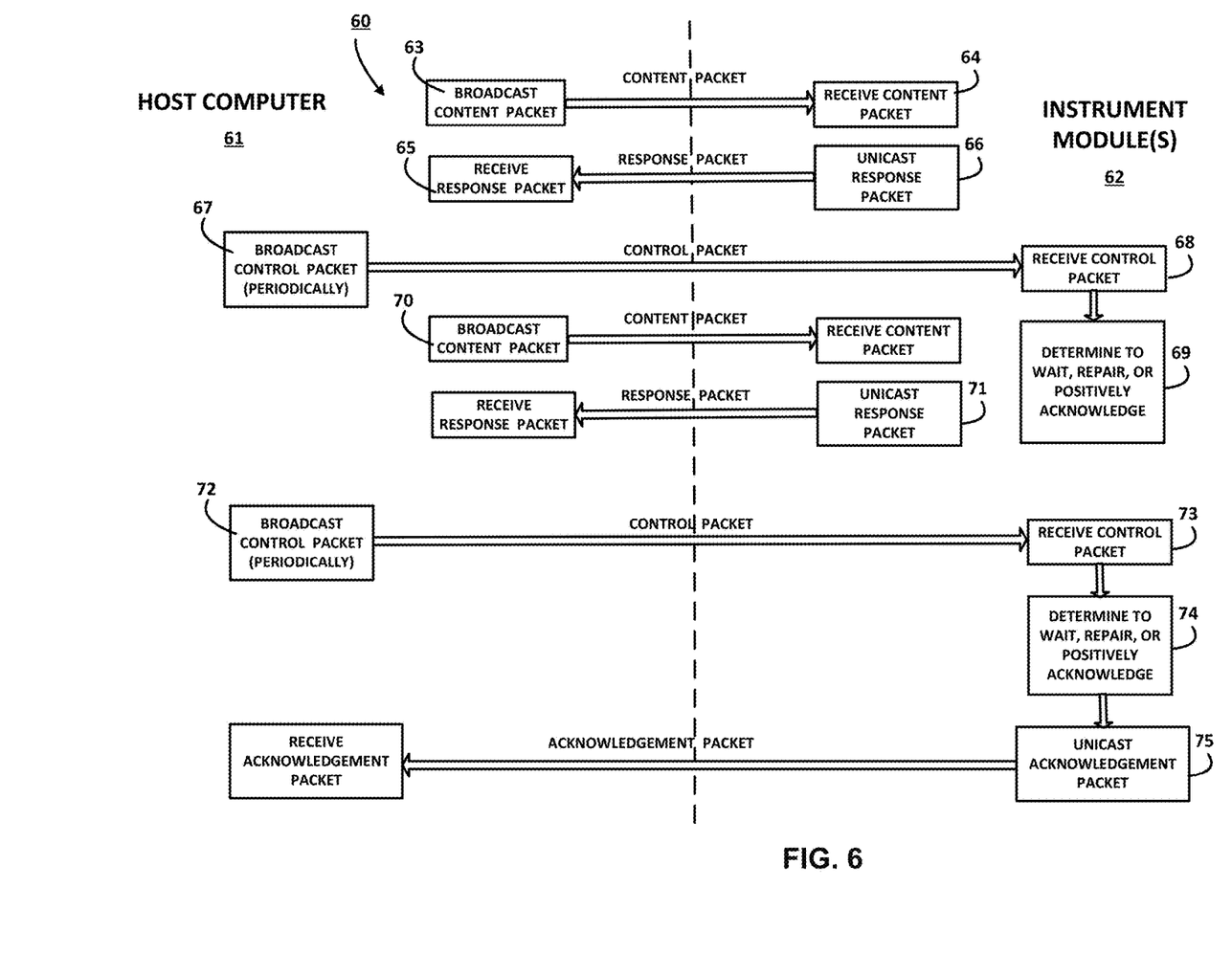
FIG. 6 is a flowchart showing communications that may be part of the example test protocol.

FIG. 6 is a flowchart showing an example process 60 that employs the example transmission protocol described herein. Operations performed on by the host computer are on host side 61 and operations performed by one or more instrument modules are on instrument module(s) side 62. In operation, the host computer broadcasts (63) content packets to the instrument modules. The instrument modules receive (64) the content packets, perform whatever processing is necessary based on the content packets, and each instrument module sends (65), via unicast, a response packet. The host computer receives (66) the response packets. Using the information in the response packets, the host computer is able to determine information to include in the control packets that it broadcasts periodically to the instrument modules.

More specifically, the host computer periodically broadcasts (67) a control packet, e.g., every N (e.g., N≥1) milliseconds (ms). The control packet may adaptively change one or more system parameters depending on the current packet loss and host computer congestion status. In some implementations, each control packet contains the traffic status of each currently-active data flow between each instrument module and the host computer, and the host computer's input queue status. In some implementations, each control packet may contain the following information for each instrument module ID, M, at an offset of M×4 relative to a reference location:

S: The sequence number of the last packet that was received from the instrument module.
L: The number of detected gap (e.g., the number dropped packets) after the sequence number S.

In some implementations, each control packet may contain the following global information that is relevant to, and usable by, each instrument module ID, M.

C: A number indicative of a congestion prediction based on the input queue length of the host computer.

S and L may be determined from information in the response packets. More specifically, as part of the communication process, the host computer receives a response packet from an instrument module, which may, or may not, be responsive to one or more content packets. As noted, the response packet may be received, via unicast, in response to a previously-transmitted content packet. The host computer identifies the instrument module that sent the response packet from the module ID, M, in the response packet. The host computer determines, based on the contents of a previously-received response packet, values for S and L, and updates those values for module ID, M. The updated values may be stored in memory on the host computer for transmission in a next control packet. In an example implementation, the host computer determines, based on the received response packet, the value of S and whether any packets are missing between S and a previously-received packet. If there are packets missing, the host computer designates the number of packets that are missing as L (where L is determined by the difference between the value of S from the most recent response packet and the value of S from an immediately preceding response packet). The host computer also assigns a value to C based on the congestion level of the host computer. The values of S, L, and C are incorporated into the control packet—in this example, S and L are incorporated at offset M×4—which is broadcast (67) to the instrument modules. In other examples, values of S, L, and C may be incorporated into the control packet at one or more other appropriate offset values.

In some implementations, each instrument module ID, M, receives the control packet (68) and, based on a four-byte word at offset M×4, determines (69) the values of S and L. Based on those values, the instrument module determines whether to wait, to send repair information to the host computer, or to send a positive acknowledgement to the host computer. In the meantime, additional content packets may be broadcast (70) by the host computer to the instrument modules, and additional response packets may be sent (71) via unicast from the instrument modules to the host computer.

In this regard, following receipt of a control packet, an instrument module searches the control packet at the appropriate offset to determine if values for that instrument module are present. When values are found, the instrument module obtains, from the control packet, S, L, and C values that are associated with M. If C dictates a change in the instrument module's packet send-rate, the instrument module adjusts its send-rate accordingly. If S has the same value as the last packet sent from the instrument module to the host computer, a positive acknowledgement may be sent at an appropriate time. If S has a value that is smaller than the value of S for that the last packet sent from the instrument module to the host computer, then other action may be taken. For example, the instrument module may resend the L packets following the last S packet sent. This may be done in a next acknowledgement packet to the host computer, or the instrument module may delay sending the L packets. The example of FIG. 6 shows a delay (69).

In this regard, in some implementations, each instrument module may maintain a configurable delay counter. The configurable delay counter may count to a number, D, that defines how long an instrument module will wait to send repair information. For example, D may define the number of control packets to be received by an instrument module before the instrument module sends repair information to the host computer. Thus, if S has a value that is smaller than the value of S for that the last packet sent from the instrument module to the host computer, the instrument module may wait to see if this happens D times in sequence (that is, S has a value that is smaller than the value of S for that the last packet sent from the instrument module to the host computer for D number of control packets received by the instrument module). If so, then the instrument module sends an acknowledgement packet containing the repair information, which may include, but is not limited to, the L packets following the S value packet received. The waiting may be performed in order to reduce the chances of resending traffic that is currently in transmit but not yet received by the host computer. In the example of FIG. 6, it is determined to wait (69) for a next control packet.

In this regard, a timer triggers broadcast (72) of a new control packet to the instrument modules. The new control packet includes, for each instrument module, M, the updated values for S, L, and C. Each instrument module receives (73) the new control packet. Each instrument module receiving the control packet may adjust its transmission based on the updated value for C. In addition, each instrument module receiving the control packet may identify the S and L parameters indexed to the instrument module by module ID, M. Each instrument module may then determine (74) whether to send repair packets or a positive acknowledgement in an acknowledgement packet, as described below. In this example, because the number of times, D, has been met, a "non-positive" acknowledgement signal is sent (75). The acknowledgement signal may contain repair information (e.g., one or more of the data packets identified by the control packet as missing a stream from the instrument module to the host computer). An example implementation of process 60 is described below.

In an example, assume a value of 2 for D. In this example, the input queue of the host computer indicates that the host computer should send a moderate warning of congestion to the module (e.g., C=2). In this example, module ID 32 lost packets 90, 91 and 92; module ID 75 lost packets 11 and 12; and module 100 did not lose any packets and has a last S value of 45. In this example, the control packet includes C=2 and S, L values of [89, 3] for module ID 32, [10, 2] for module ID 75, and [45, 0] for module ID 100. The host computer broadcasts a control packet containing the above value of C, and values of [S, L] for each instrument module. This broadcast is sent over an Ethernet-based network, such as a LAN, and is part of a periodic broadcasting process, as described herein. Although only three modules are noted here, information for any appropriate number of instrument modules may be included in the control packet, e.g., 200 or more instrument modules in some cases.

Since C=2, following receipt of the control packet, every active module (e.g., modules 32, 75, 100) will reduce its send rate according to the specified congestion level of 2.

Also, since D=2, each module will not act following receipt of a first control packet unless a positive acknowledgement signal is in order. If a positive acknowledgement signal is not in order, as appropriate, each instrument module will wait until a second control packet is received containing all or some of the same information as in the preceding control packet. For example, the next control packet may indicate that module 75 has all recovered, that module 32 still is missing packets 91, 92, and that the congestion has cleared, so C=0. That is, the next control packet includes C=0 and S, L values of [90, 2], [15, 0], and [45, 0]. In this example, following receipt of this next control packet (i.e., D=2), every active module will increase its send rate to correspond to C=0, and module 32 will retransmit, via unicast, packets 91 and 92 to the host computer as part of one or more acknowledgement packets that are responsive to the second control packet. The other instrument modules transit positive acknowledgements via unicasting.

Figure 7:
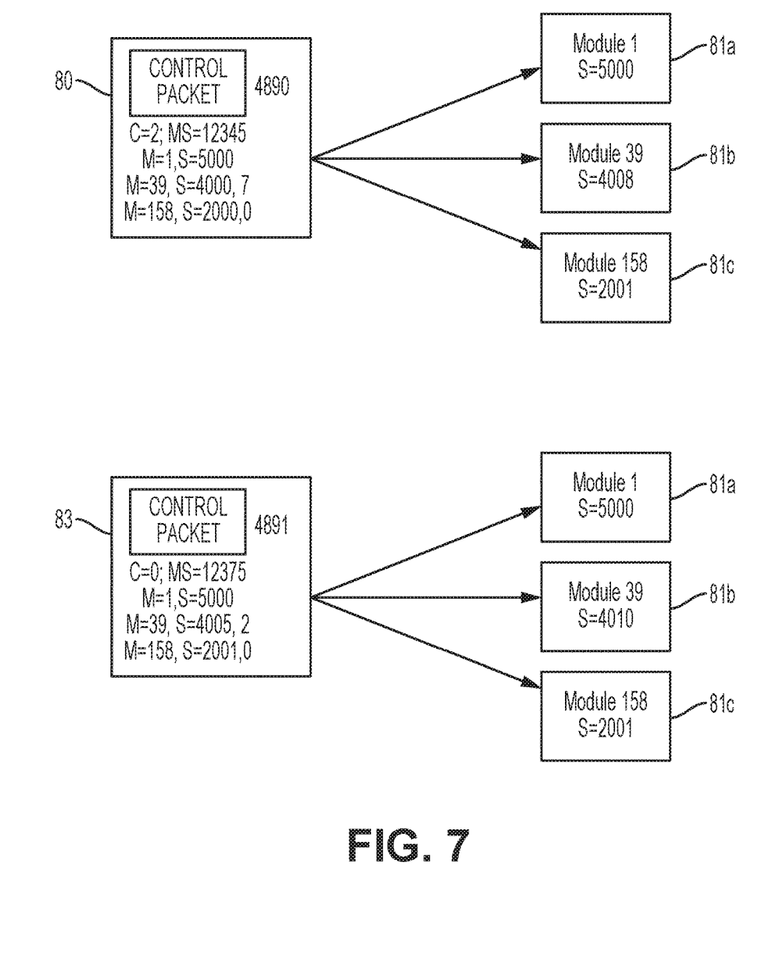
FIG. 7 is a block diagram showing an example control packet containing information for instrument modules in the example test protocol.

In another example, in FIG. 7, a control packet 4890 80 is broadcast to all active instrument modules 81*a*, 81*b*, 81*c*. C=2 indicates the presence of some congestion based on the input queue length of the host computer. In response to receipt of the control packet, all instrument modules throttle-down to send data at a rate appropriate for C=2. Module 1 identifies S=5000, and responds with a positive acknowledgement packet. A positive acknowledgement packet, in this example, includes data indicating that all packets have been sent and received in the current packet flow. Module 39 identifies 7 packets missing based on the control packet 4890 80 and waits until D=2 control packets have been received. Module 158 identifies 1 packet missing based on the control packet 4890 80 and waits until D=2 control packets have been received. As indicated above, waiting for D=2 means to wait for the next control packet in case some packets in transit have not yet been reflected as received in the current control packet.

The next control packet 4891 83 is broadcast to all active instrument modules. Each instrument module receives this control packet, so D=2 in this case, and the instrument modules may respond with repair information, if necessary. In this control packet, C=0 indicates that the congestion has been relieved, and all instrument modules may broadcast at their normal, or maximum, rate. Module 1 identifies S=5000, and responds again with a positive acknowledgement packet. Module 39 identifies that packets 4006 and 4007 are still missing based on control packet 4891 83 and sends packets 4006 and 4007 to the instrument module as repair information as part of one or more acknowledgement packets. Module 158 identifies that S=2001, which means that all packets have been received. Accordingly, module 158 sends a positive acknowledgement packet to the host computer.

Testing performed using the example test protocol described herein may be implemented using hardware or a combination of hardware and software. For example, a test system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The techniques described herein may be performed by automatic test equipment or any other appropriate computing device. The techniques can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes or does not include intervening components but that nevertheless allows electrical signals to flow between connected components. Any "connection" involving electrical circuitry mentioned herein that allows signals to flow between two points, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
   instrument modules to control testing of one or more devices under test;
   an Ethernet-based communication network; and
   a computing system configured to broadcast, periodically, control packets over the Ethernet-based communication network to the instrument modules, a control packet comprising data representing sequence numbers of last data packets received from the instrument modules and information based on each sequence number, the control packet comprising slots for all of the instrument modules, each slot containing the data that is specific to one of the instrument modules and each slot being indexed based on an identifier for the one of the instrument modules;

the computing system also being configured to receive, via unicast and over the Ethernet-based communication network, an acknowledgement packet from each of the instrument modules in response to the control packet, the acknowledgement packet comprising repair information that is based on the control packet received by the instrument module from the computing system.

2. The test system of claim 1, wherein the repair information comprises data packets having sequence numbers missing from data packets received by the computing system from the instrument module.

3. The test system of claim 1, wherein the control packet comprises information indexed based on an instrument module identifier for access by an instrument module having the instrument module identifier.

4. The test system of claim 1, wherein the control packet comprises global information, the global information being usable by each of the instrument modules to regulate a communication connection of message traffic between the computing system and the instrument module.

5. The test system of claim 4, wherein the global information comprises traffic congestion status of the computing system.

6. The test system of claim 5, wherein the traffic congestion status comprises one or more of: congestion window control information or data flow control information.

7. The test system of claim 1, wherein the information based on a sequence number comprises a number of dropped packets after the sequence number.

8. The test system of claim 1, wherein the computing system is configured to send broadcast messages over the Ethernet-based communication network to the instrument modules, a broadcast message comprising a data packet comprising a sequence number, steering information to identify instrument modules, and commands defining actions to be taken; and wherein the computing system is also configured to receive, over the Ethernet-based communication network, a unicast message from each of the instrument modules in response to the data packet, each unicast message comprising response data from an instrument module that sent the unicast message.

9. The test system of claim 8, wherein the data packet comprises a first data item representing a request for test information from the instrument module, and wherein at least some of the response data represents the test information.

10. The test system of claim 8, wherein the computing system is configured to determine, based on a sequence number of a last data packet received by the computing system, that one or more data packets are missing from an instrument module, and the computing system is configured to broadcast a control packet identifying that one or more data packets are missing.

11. The test system of claim 10, wherein the computing system is configured to receive, via unicast message, the one or more data packets that are missing in response to the control packet.

12. The test system of claim 1, wherein the Ethernet-based communication network comprises a local area network (LAN).

13. The test system of claim 1, wherein the computing system is configured to broadcast Ethernet communications among the control packets.

14. A method, performed on automatic test equipment, of communicating between a computing system and instrument modules, the method comprising:

broadcasting periodically, from the computing system, control packets over an Ethernet-based communication network to the instrument modules, a control packet comprising data representing sequence numbers of last data packets received from the instrument modules and information based on the sequence numbers, the control packet comprising slots for all of the instrument modules, each slot containing the data that is specific to one of the instrument modules and each slot being indexed based on an identifier for the one of the instrument modules; and receiving, at the computing system and in response to the control packet, via unicast and over the Ethernet-based communication network, an acknowledgement packet from each of the instrument modules, the acknowledgement packet comprising repair information that is based on a broadcast control packet received by the instrument module from the computing system.

15. The method of claim 14, wherein the repair information comprises data packets having sequence numbers missing from data packets received by the computing system from the instrument module.

16. The method of claim 15, wherein the control packet comprises information indexed based on instrument module identifier for access by an instrument module having the instrument module identifier.

17. The method of claim 14, wherein the control packet comprises global information, the global information being usable by each of the instrument modules to regulate a communication connection of message traffic between the computing system and the instrument module.

18. The method of claim 17, wherein the global information comprises traffic congestion status of the computing system.

19. The method of claim 18, wherein the traffic congestion status comprises one or more of: congestion window control information or data flow control information.

20. The method of claim 14, wherein the information based on a sequence number comprises a number of dropped packets after the sequence number.

21. The method of claim 14, further comprising:

sending, from the computing system, broadcast messages over the Ethernet-based communication network to the instrument modules, a broadcast message comprising a data packet comprising a sequence number, steering information to identify instrument modules, and commands defining actions to be taken; and receiving, at the computing system and over the Ethernet-based communication network, a unicast message from each of the instrument modules in response to the data packet, each unicast message comprising response data from an instrument module that sent the unicast message.

22. The method of claim 21, wherein the data packet comprises a first data item representing a request for test information from the instrument module, and wherein at least some of the response data represents the test information.

23. The method of claim 21, further comprising:
- determining, by the computing system and based on a sequence number of a last data packet received by the computing system, that one or more data packets from an instrument module are missing; and
- broadcasting, from the computing system, a control packet identifying that one or more data packets are missing.

24. The method of claim 23, further comprising:
- receiving, at the computing system and via unicast message, the one or more data packets that are missing in response to the control packet.

25. The method of claim 14, wherein the Ethernet-based communication network comprises a local area network (LAN).

26. The method of claim 14, wherein the computing system broadcasts Ethernet communications among the control packets.

\* \* \* \* \*